(12) United States Patent
Stoll

(10) Patent No.: US 7,049,987 B2
(45) Date of Patent: May 23, 2006

(54) ARRANGEMENT FOR GENERATING A CLOCK SIGNAL FOR A SIGMA-DELTA ANALOG-TO-DIGITAL CONVERTER

(75) Inventor: Walter Stoll, Sattel (CH)

(73) Assignee: Siemens Building Technologies AG, Münich (DE)

( * ) Notice: Subject to any disclaimer, the term of this patent is extended or adjusted under 35 U.S.C. 154(b) by 0 days.

(21) Appl. No.: 10/900,027

(22) Filed: Jul. 26, 2004

(65) Prior Publication Data

US 2005/0062625 A1    Mar. 24, 2005

Related U.S. Application Data

(60) Provisional application No. 60/494,394, filed on Aug. 12, 2003.

(51) Int. Cl.
*H03M 3/00* (2006.01)
*H03M 1/00* (2006.01)

(52) U.S. Cl. .................. 341/122; 327/291; 327/114
(58) Field of Classification Search .......... 341/122, 341/123, 143; 327/114, 115, 291, 292, 293
See application file for complete search history.

(56) References Cited

U.S. PATENT DOCUMENTS

| | | | | | |
|---|---|---|---|---|---|
| 4,685,614 | A | * | 8/1987 | Levine | 341/157 |
| 4,868,573 | A | * | 9/1989 | Wittmer | 341/157 |
| 4,993,052 | A | * | 2/1991 | Hammelsbacher | 377/52 |
| 5,349,352 | A | * | 9/1994 | Saleh | 341/143 |
| 5,617,090 | A | * | 4/1997 | Ma et al. | 341/141 |
| 6,169,506 | B1 | * | 1/2001 | Oprescu et al. | 341/143 |
| 6,259,291 | B1 | * | 7/2001 | Huang | 327/160 |

* cited by examiner

*Primary Examiner*—Howard Williams
(74) *Attorney, Agent, or Firm*—Maginot, Moore & Beck

(57) ABSTRACT

In a method for generating a scanning clock signal (S) for scanning an analog signal (Ua) for an analog-to-digital converter (20) operating according to the sigma-delta method, a variable period (T; T*) of the power supply system (PL) is ascertained in time units of a system clock signal (C), and the scanning clock signal (S) is generated by distributing a constant number K of pulses over the ascertained period (T; T*), so that the frequency of the scanning clock signal (S) is an integer multiple of the frequency of the power supply system (PL). The method is essentially able to be carried out by an accumulator unit (4) connected to a counter (3) and makes possible the advantage that during the analog-to-digital conversion a mains hum contained in the analog signal (Ua) is suppressed.

7 Claims, 3 Drawing Sheets

ARRANGEMENT FOR GENERATING A CLOCK SIGNAL FOR A SIGMA-DELTA ANALOG-TO-DIGITAL CONVERTER

This application claims priority to co-pending provisional application No. 60/494,394, filed on Aug. 12, 2003.

BACKGROUND OF THE INVENTION

1. Field of the Invention

The invention relates to a method for generating a scanning clock signal for scanning an analog signal for an analog-to-digital converter operating according to the sigma-delta method, and also relates to an apparatus for carrying out the method.

2. Description of the Prior Art

Such methods and arrangements are suitable when converting analog signals into digital signals, for example in an apparatus for the monitoring, control and regulation of an administration and maintenance unit of a building.

The administration and maintenance unit is for example a heating, ventilation and air-conditioning unit, with access and fire-monitoring equipment or generally a building automation unit or a building management system. In particular, room-climate variables such as room temperature, air humidity and air quality are also influenced by the administration and maintenance unit. In the administration and maintenance unit, a large number of so-called field devices such as sensors and servo elements are to be operated by electric signals. As a rule, analog signals of the field devices are converted into digital signals by analog-to-digital converters for transmission and/or for processing.

Typically, an analog signal is unfortunately also overlaid by an interference variable which is modulated onto the analog useful signal by electric and/or magnetic fields of the power supply network or by components connected to the power supply system. The analog useful signal is for example the signal, corresponding to a measured physical variable, of a sensor; for example of a temperature or moisture sensor. The said interference variable has the frequency of the power supply system and is also called mains hum. The mains hum is often not negligible, in particular in the case of analog signals in a building.

When an analog signal is converted into a digital signal, analog-to-digital converters are widely used which operate by the so-called sigma-delta method. If, in the case of the sigma-delta method, the scanning rate used during the scanning of an analog signal and the decimation rate are suitably chosen, it is known that the sigma-delta method can also act as a filter for certain frequencies of the analog signal. However, an adequate suppression of mains hum can be achieved only if the quotient formed from the scanning rate and from the frequency of the power supply system is constant. As a rule, the scanning rate is derived from an oscillator stabilized with a quartz.

The frequency of the power supply system is 50 Hz in certain regions and countries, but 60 Hz in others. Moreover, the frequency can deviate from a rated value depending on the quality of the power supply system. In the present case a deviation of +/−4% from the rated value is expected.

Without special measures, an adequate suppression of mains hum during an analog-to-digital conversion can be achieved only for either 50-Hz or 60-Hz systems, which stands in the way of a product able to be used world-wide.

SUMMARY OF THE INVENTION

The object of the invention is to provide a method for generating a scanning clock signal for an analog-to-digital converter operating according to the sigma-delta method which adequately suppresses mains hum in all regions. An apparatus is also to be created with which the method can be carried out.

According to a first aspect, the present invention provides a method for generating a scanning clock signal for scanning an analog signal for an analog-to-digital converter operating according to the sigma-delta method, comprising the method steps of:

ascertaining a variable period of the power supply system in time units of a system clock signal, and generating the scanning clock signal by distributing a constant number K of pulses over the ascertained period, so that the frequency of the scanning clock signal is an integer multiple of the frequency of the power supply system.

According to a second aspect, the present invention provides apparatus for carrying out the method of the first aspect of the invention, the apparatus comprising:

a counter able to be clocked by the system clock signal, a signal derived from the power supply system being able to be conducted at an input of the counter, so that the period of the power supply system is able to be counted in time units of the system clock signal by the counter, and an accumulator unit, able to be clocked by the system clock signal, including an adding register, to which the counted period is able to be allocated as a counting limit and in which the current value of the adding register is able to be increased by a constant value W with every pulse of the system clock signal, the accumulator unit including an output for the scanning clock signal at which a pulse is able to be generated if the counting limit is exceeded.

Preferred designs of the invention are claimed in the dependent claims.

BRIEF DESCRIPTION OF THE DRAWINGS

Embodiments of the invention are explained in more detail below with the help of the drawings.

DESCRIPTION OF THE PREFERRED EMBODIMENTS

Figure 1:
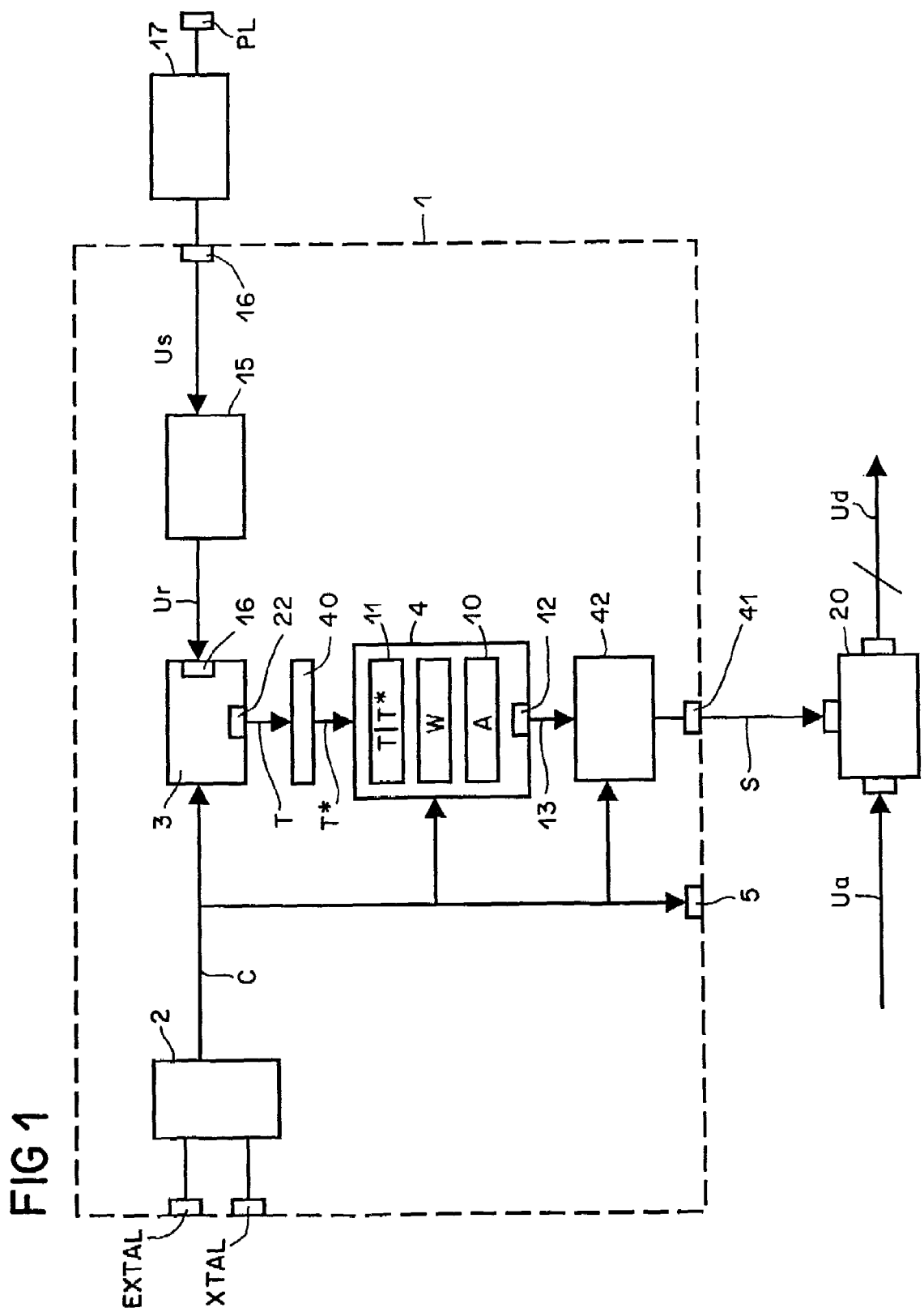
FIG. 1 is a block diagram with an analog-to-digital converter and an arrangement for generating a scanning clock signal.

In FIG. 1, a clock generator numbered 1 has an oscillator 2, a counter 3 and an accumulator unit 4. The oscillator 2 generates a system clock signal C which is conducted to the counter 3 and the accumulator unit 4 and advantageously also to a first connection point 5 of the clock generator 1.

The oscillator 2 is preferably stabilized via an externally arranged quartz which for example is able to be connected via a second connection point XTAL and a third connection point EXTAL of the clock generator 1 to the oscillator 2.

The accumulator unit 4 advantageously has an adding register 10, a further register 11 and an output 12 for an output signal 13.

The clock generator 1 advantageously also includes a signal converter 15 by which a sinusoidal alternating voltage Us applied to an input of the signal converter 15 is converted into a rectangular signal Ur which is conducted from an output of the signal converter 15 to an input 16 of the counter 3 and which displays the period T of the alternating voltage Us. The signal converter 15 is for example a comparator circuit.

The alternating voltage Us is taken from the power supply system PL and interference advantageously eliminated before it is fed via a fourth connection point 16 in an adapter 17 and brought to a necessary voltage level.

As the frequency of the alternating voltage delivered by the power supply system PL is typically 50 Hz or 60 Hz depending on region, and in addition the rated frequency can fluctuate within certain tolerance limits, here the frequency of the power supply system PL and thus naturally also the period T associated with it are basically assumed to be variable.

The adapter 17 advantageously includes a low-pass filter. The adapter 17 is typically not integrated together with the clock generator 1 in one component.

According to the invention the stated object is achieved by a method in which, in a first method step, the variable period T of the power supply system PL is ascertained in time units of the system clock signal C and further, in a second method step, a scanning clock signal S is generated by distributing a constant number K of pulses over the ascertained period T, so that the frequency of the scanning clock signal S is an integer multiple of the frequency of the power supply system.

If the number K is chosen equal to the value of the decimation rate of an analog-to-digital converter 20 operating according to the sigma-delta method, and in the analog-to-digital converter 20 the scanning clock signal S is used to scan a supplied analog signal Ua, the mains hum of the analog signal Ua can be optimally suppressed or filtered out during scanning. The digital signal Ud generated by the analog-to-digital converter 20 from the analog signal Ua is thus also optimally freed of mains hum if the frequency of the power supply system PL changes. The automatic optimal suppression of mains hum is achieved regardless of whether the clock generator 1 is used in regions with a different frequency of the power supply system PL, or whether the frequency of the power supply system PL fluctuates for other reasons.

The achievable accuracy with which the period T of the power supply system PL can be recorded is determined by the value of the frequency of the system clock signal C. As a rule, the system clock signal C is also able to be used for the clocking of other components not discussed in connection with the present invention—such as for example microprocessors or multiplexers—the requirements of which can co-determine the necessary frequency of the system clock signal C. In a version of the invention serving as an example, let the frequency of the system clock signal C be roughly 5 MHz.

In an advantageous version of the invention, the counter 3 clocked with the system clock signal C ascertains the period T of the power supply system PL in time units of the system clock signal C. The period T ascertained by counting pulses of the system clock signal C arriving in a period of the rectangular signal Ur is available at an output 22 of the counter 3.

In the accumulator unit 4, the ascertained period T is stored in the register 11 and used as a counting limit or maximum value for the adding register 10. With every pulse of the system clock signal C, the current contents A of the adding register 10 are increased by a constant value W, a pulse of the output signal 13 being generated if the counting limit is exceeded at the output 12, and only a residual value being stored in the adding register 10. The residual value is the value of the integer division of the contents A of the adding register 10 by the current counting limit. A so-called modulo-division is thus carried out; represented in pseudocode: A:=(A+W) modulo T. A constant number, equated to the value W, of pulses are thus able to be generated, uniformly distributed, at the output 12 over a period of time equated with the period T.

Figure 2:
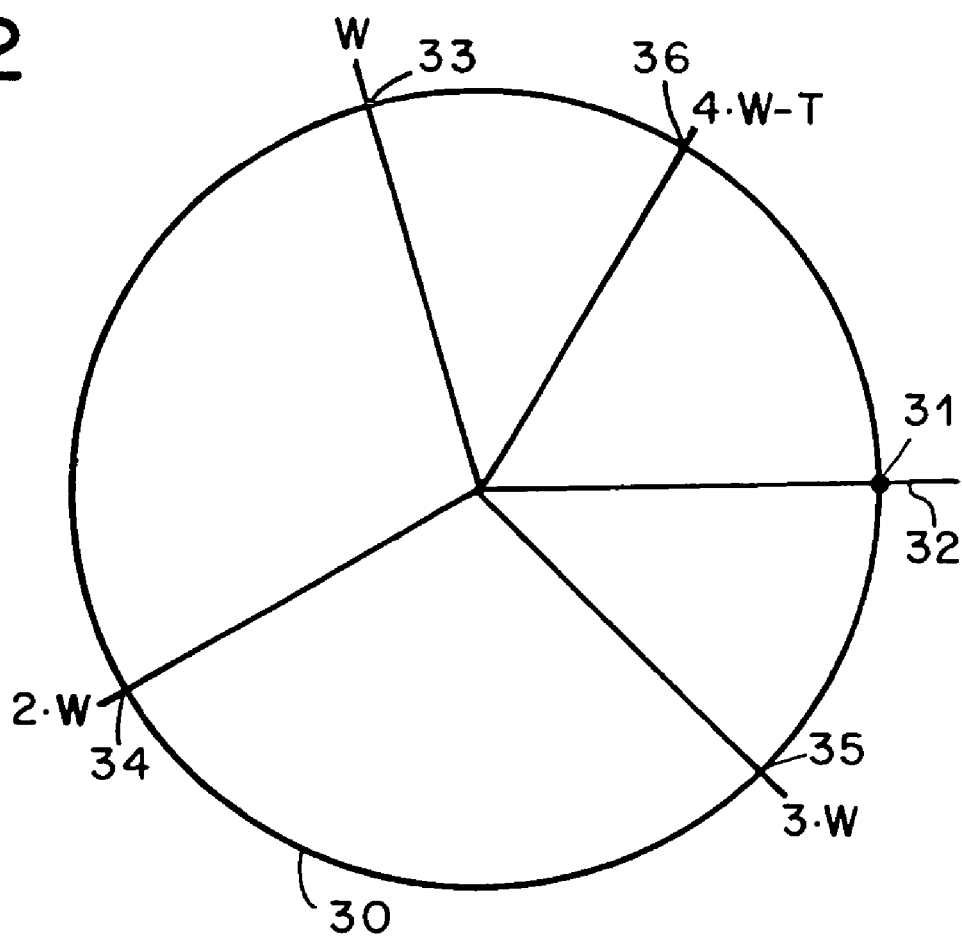
FIG. 2 is a representation showing the mode of operation of the arrangement.

The principle of the mode of operation of the accumulator unit is illustrated in FIG. 2. The current period T is represented by the circumference of a circle 30. A point of intersection 31 of the circle 30 with a centre line 32 represents both the minimum contents A of the adding register 10—namely zero—and also the maximum contents A—namely the counting limit. With every pulse of the system clock signal C, the constant value W is added to the current contents A. If one begins at zero, then, in the example shown, after the first pulse the adding register 10 contains the value W represented by a point 33, after the second pulse the doubled value W represented by a point 34, and after the third pulse the trebled value W represented by a point 35. After the fourth pulse the counting limit is exceeded in the point of intersection 31, a pulse of the output signal 13 being generated at the output 12 of the accumulator unit 4 (FIG. 1) and the contents A of the adding register 10 being set at the quadrupled value W, represented by a point 36, reduced by the period T. In this model the circumference of the circle 30 changes according to any change in the frequency of the power supply system.

In a concrete example, let the frequency of the power supply system be 50 Hz and the frequency of the system clock signal 5 MHz. Let the constant value W be 16,384 i.e. $2^{14}$. The circumference of the circle 30 thus corresponds to a figure 100,000. The contents A of the adding register 10 are represented in the following table for eight pulses of the system clock signal C starting from zero:

| Pulse of the system clock signal | Contents A | Pulse at output 12 |
|---|---|---|
| 0 | 0 | No |
| 1 | 16384 | No |
| 2 | 32768 | No |
| 3 | 49152 | No |
| 4 | 65536 | No |
| 5 | 81920 | No |
| 6 | 98304 | No |
| 7 | 14688 | Yes |
| 8 | 31072 | No |

Whenever the counting limit is exceeded in the adding register 10, a pulse is generated at the output 12 of the accumulator unit 4. Thus in the example 16,384 pulses are distributed uniformly over the measured period T of the power supply system.

When ascertaining the period T, errors can occur which are caused for example by disturbances affecting the sinusoidal alternating voltage Us applied to the fourth connection point 16, and are able to be corrected for example by a low-pass filter. To correct such errors, in an advantageous variant form of the invention a digital filter 40 is connected between the counter 3 and the accumulator unit 4. The period T counted by the counter 3 is converted by the digital filter 40 into a filtered period T*.

The counting limit stored in the register 11 is thus the filtered period T* when the filter 40 is used.

The scanning clock signal S available at a fifth connection point 41 is prepared in the clock generator 1 such that the mains hum of the analog signal Ua scanned in the analog-to-digital converter 20 is optimally suppressed during scanning. The desired optimal suppression is achieved when the rate of the scanning clock signal S is equal to the product formed from the frequency of the power supply system and the decimation rate of the analog-to-digital converter 20 used.

For power supply systems with a frequency of 50 Hz and a decimation rate of $2^{13}=8192$ a scanning clock signal S is thus required which constantly displays 8192 pulses for each pulse of the power supply system which are uniformly distributed over a period of the power supply system.

The analog-to-digital converter 20 operating according to the sigma-delta method typically demands a symmetrical scanning clock signal S, i.e. pulse and pause should be of equal length.

The scanning clock signal S is able to be generated sufficiently symmetrically if it is taken at the output of a frequency divider stage 42 advantageously clocked by the system clock signal C, the input of which is fed with the output signal 13 of the accumulator unit 4. A lowering of the frequency carried out by the frequency divider stage 42 is compensated for in the accumulator unit 4 by a corresponding increase in the constant value W.

The frequency divider stage 42 advantageously halves the frequency of the output signal 13 delivered by the accumulator unit 4, which is compensated for in the accumulator unit 4 if the constant value W is set at double the decimation rate of the analog-to-digital converter 20.

In a variant version without the frequency divider stage 42, the constant value W is set at the decimation rate of the analog-to-digital converter 20 in the accumulator unit 4.

A constant ratio between the rate of the scanning clock signal S and the frequency of the power supply system PL was also able to be achieved through a so-called phase-locked-loop (PLL). However, problems occur upon an implementation of the classic PLL circuit as an integrated circuit if the two frequencies to be matched to each other, as in the present case, lie so far apart and one of the two frequencies, such as here the system frequency, is relatively low.

Unlike a classic PLL, a digital circuit according to the present invention together with the analog-to-digital converter 20 and if needed with further circuit units can be implemented without problems even in a so-called application specific integrated circuit (ASIC).

Figure 3:
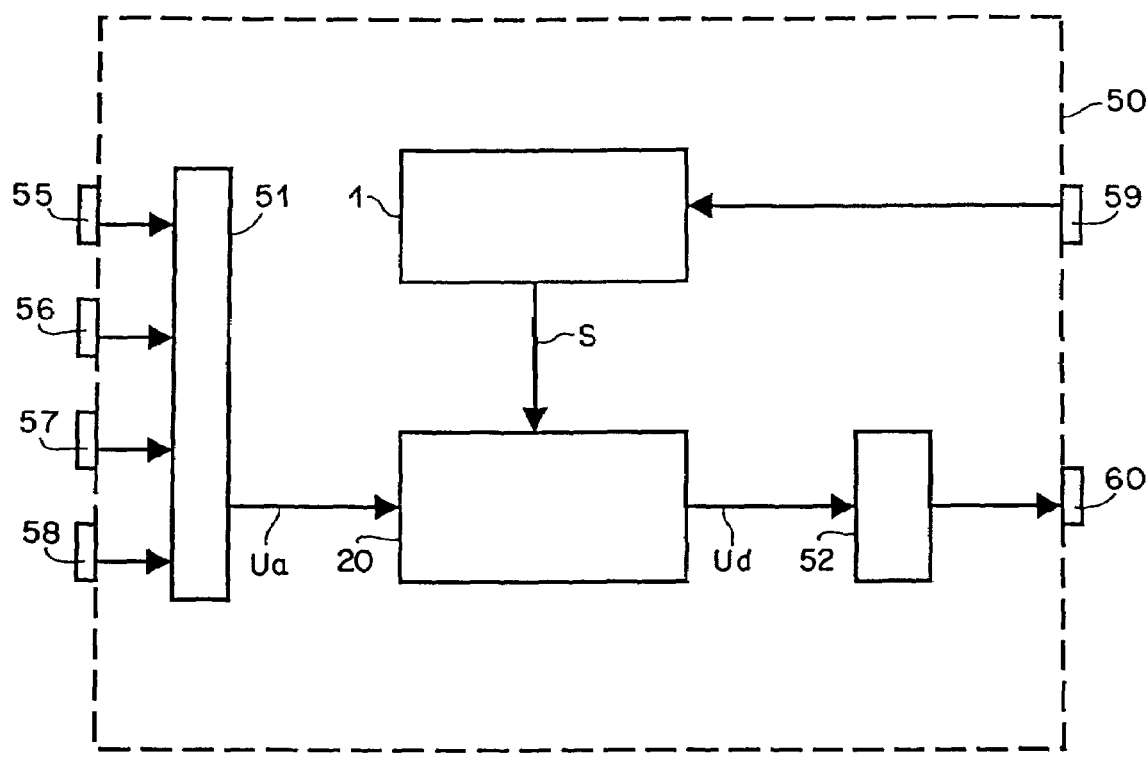
FIG. 3 is a block diagram relating to the application of the arrangement.

Some part-circuits of an ASIC 50 are represented in FIG. 3. The ASIC 50 comprises the clock generator 1, the analog-to-digital converter 20 and also at least one multiplexer 51 and a communication interface 52. The analog-to-digital converter 20 is able to be connected via the multiplexer 51 on the input side to terminals 55, 56, 57 or 58 which for their part are able to be connected to various field devices. The applied analog signal Ua is read by the scanning clock signal S generated by the clock generator 1. The clock generator 1 is able to be connected via a further terminal 59 to an alternating voltage of the power supply system. On the output side, the analog-to-digital converter 20 is able to be connected via the communication interface 52 for example to a processor connected to a port 60.

REFERENCE NUMBERS

1 Clock generator
2 Oscillator
3 Counter
4 Accumulator unit
5 Connection point, first
10 Adding register
11 Register, further
12 Output
13 Output signal
15 Signal converter
16 Connection point, fourth
17 Adapter
20 Analog-to-digital converter
22 Output
30 Circle
31 Point of intersection
32 Centre line
33, 34, 35, 36 Point (on 30)
40 Digital filter
41 Connection point, fifth
42 Frequency divider stage
50 asic
51 multiplexer
52 communication interface
55, 56, 57, 58 terminals
59 terminal, further
60 port
C system clock signal
XTAL connection point, second (quartz)
EXTAL connection point, third (quartz)
S scanning clock signal
T period
T* filtered period
PL power supply system
Us sinusoidal alternating voltage
Ur rectangular signal
Ua analog signal
Ud digital signal
A contents of 10
K constant number
W constant value

I claim:

1. Method for generating a scanning clock signal for scanning an analog signal for an analog-to-digital converter operating according to the sigma-delta method, comprising the method steps of:
    ascertaining a variable period of the power supply system in time units of a system clock signal, and
    generating the scanning clock signal by distributing a constant number K of pulses over the ascertained period, so that the frequency of the scanning clock signal is an integer multiple of the frequency of the power supply system.

2. Method according to claim 1, wherein the number K is equal to the value of the decimation rate of the analog-to-digital converter.

3. Apparatus for carrying out a method according to claim 1, the apparatus comprising:
    a counter able to be clocked by the system clock signal, a signal derived from the power supply system being able to be conducted at an input of the counter, so that the period of the power supply system is able to be counted in time units of the system clock signal by the counter, and an accumulator unit, able to be clocked by the system clock signal, including an adding register, to which the counted period is able to be allocated as a counting limit and in which the current value of the adding register is able to be increased by a constant value W with every pulse of the system clock signal, the accumulator unit including an output for the scanning clock signal at which a pulse is able to be generated if the counting limit is exceeded.

4. Apparatus according to claim 3, further comprising a digital filter, connected between the counter and the accumulator unit, by which the period counted by the counter is able to be filtered.

5. Apparatus according to claim 3, wherein the value W is equal to the value of the decimation rate of the analog-to-digital converter.

6. Apparatus according to claim 3, wherein the value W is equal to double the value of the decimation rate of the analog-to-digital converter.

7. Apparatus according to claim 6, further comprising a frequency divider, connected downstream from the accumulator unit, by which the frequency of the output signal of the accumulator unit is able to be halved.

* * * * *